United States Patent [19]
Gupta et al.

[11] Patent Number: 5,994,206
[45] Date of Patent: Nov. 30, 1999

[54] METHOD OF FORMING A HIGH CONDUCTIVITY METAL INTERCONNECT USING METAL GETTERING PLUG AND SYSTEM PERFORMING THE METHOD

[75] Inventors: Subhash Gupta, San Jose; Susan Hsuching Chen, Sunnyvale, both of Calif.

[73] Assignee: Advanced Micro Devices, Inc., Sunnyvale, Calif.

[21] Appl. No.: 08/944,170

[22] Filed: Oct. 6, 1997

[51] Int. Cl.$^6$ .................. H01L 21/225; H01L 21/385
[52] U.S. Cl. .................. 438/476; 438/637; 438/675; 438/686; 438/687; 438/688; 438/632; 438/646
[58] Field of Search .................. 438/476, 637, 438/632, 639, 641, 646, 675, 686, 687, 688; 204/192.35

[56] References Cited

U.S. PATENT DOCUMENTS

| | | | |
|---|---|---|---|
| 5,016,081 | 5/1991 | Brown et al. .......................... | 257/763 |
| 5,305,519 | 4/1994 | Yamamoto et al. .................... | 438/623 |
| 5,356,836 | 10/1994 | Chen et al. ............................ | 438/627 |
| 5,454,885 | 10/1995 | Dudoff et al. ......................... | 438/476 |
| 5,478,758 | 12/1995 | Easter .................................... | 438/402 |
| 5,591,673 | 1/1997 | Chao et al. ............................ | 438/631 |
| 5,637,534 | 6/1997 | Takeyasu et al. ..................... | 438/637 |
| 5,668,064 | 9/1997 | Park et al. ............................. | 438/637 |
| 5,698,891 | 12/1997 | Tomita et al. ......................... | 257/610 |

Primary Examiner—Richard Booth
Assistant Examiner—Ha Tran Nguyen
Attorney, Agent, or Firm—Sawyer & Associates

[57] ABSTRACT

A method and system for providing a via structure for a high conductivity metal of a integrated circuit is disclosed. In a first aspect the method and system comprises etching a photoresist material and a dielectric material down to the high conductivity metal to form a via hole. The via hole includes sputtered high conductivity metal on the sidewalls. The method and system further includes providing a via plug material within the via hole. The vial plug material substantially covers a base portion of the high conductivity metal and the sidewalls of the via hole. The via plug material is also capable of gettering or dissolving the high conductivity metal sputtered on the sidewalls of the dielectric material. In a second aspect, a via structure for an integrated circuit is disclosed in accordance with the present invention. The via structure includes a high conductivity metal and a dielectric material surrounding the high conductivity metal. The dielectric material includes sidewalls to form a via hole on tope of the high conductivity metal. The via structure further includes a via plug material covering the high conductivity metal and substantially filling the via hole. The via plug material is also capable of gettering or dissolving the high conductivity metal sputtered on the sidewalls of the via hole. Accordingly, by providing a via plug material within the via hole, the via plug material getters or dissolves the high conductivity metal that reaches the sidewalls of the dielectric layer during the via etch and sputter etch processes and the junction poisoning problems associated therewith are substantially minimized.

20 Claims, 6 Drawing Sheets

METHOD OF FORMING A HIGH CONDUCTIVITY METAL INTERCONNECT USING METAL GETTERING PLUG AND SYSTEM PERFORMING THE METHOD

FIELD OF THE INVENTION

The present invention relates generally to integrated circuits and more particularly to a method and system for minimizing diffusion of a high conductivity metal sputtered into a via hole in such a circuit.

BACKGROUND OF THE INVENTION

High conductivity of the interconnects or the metal layers of an integrated circuit is important for the efficient operation of such a circuit, particularly at submicron technologies. In previous integrated circuits, aluminum has been utilized to provide the interconnect for the device. However, as standards for speed have increased, i.e., smaller and smaller process technologies (0.18 μm and lower), other metals have been used. In a preferred embodiment, high conductivity metal such as copper, gold and platinum have been used as the interconnect to enhance the speed of the device.

High conductivity interconnects in particular are highly desirable for advanced wirings in logic technology. However, high conductivity metals such as copper, gold and platinum have very high diffusivity through several dielectrics. This high diffusivity is a problem because in a typical processing of the device, the metal will get sputtered from a bottom metal layer onto the sidewall of the device. This elemental layer then has to be removed in order to prevent any diffusion from the walls of the via to minimize poisoning of the junction. Conventional chemical processes employed to remove high conductivity metal from the sidewall of the dielectric material will also remove/attack high conductivity metal at the base of the via. Accordingly, although the high conductivity interconnects increase the overall performance of the device, they also provide challenges in manufacturing the device.

What is needed, therefore, is a system and method which minimizes the poisoning of associated with high conductivity metals that also have high diffusivity. The system and method should be easy to implement and cost effective. The system and method should also be easily adaptable utilizing conventional processing techniques.

The present invention addresses such a need.

SUMMARY OF THE INVENTION

A method and system for providing a via structure for a high conductivity metal of a integrated circuit is disclosed. In a first aspect the method and system comprises etching a photoresist material and a dielectric material down to the high conductivity metal to form a via hole. The via hole includes sputtered high conductivity metal on the sidewalls. The method and system further includes providing a via plug material within the via hole. The via plug material substantially covers a base portion of the high conductivity metal and the sidewalls of the via hole. The via plug material is also capable of gettering or dissolving the high conductivity metal sputtered on the sidewalls of the dielectric material.

In a second aspect, a via structure for an integrated circuit is disclosed in accordance with the present invention. The via structure includes a high conductivity metal and a dielectric material surrounding the high conductivity metal. The dielectric material includes sidewalls to form a via hole on tope of the high conductivity metal. The via structure further includes a via plug material covering the high conductivity metal and substantially filling the via hole. The via plug material is also capable of gettering or dissolving the high conductivity metal sputtered on the sidewalls of the via hole.

Accordingly, by providing a via plug material within the via hole, the via plug material getters or dissolves the high conductivity metal that reaches the sidewalls of the dielectric layer during the via etch and sputter etch processes and the junction poisoning problems associated therewith are substantially minimized.

DESCRIPTION OF THE INVENTION

The present invention relates to minimizing diffusion of a high conductivity metal sputtered into a via hole in an integrated circuit during a via etch. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
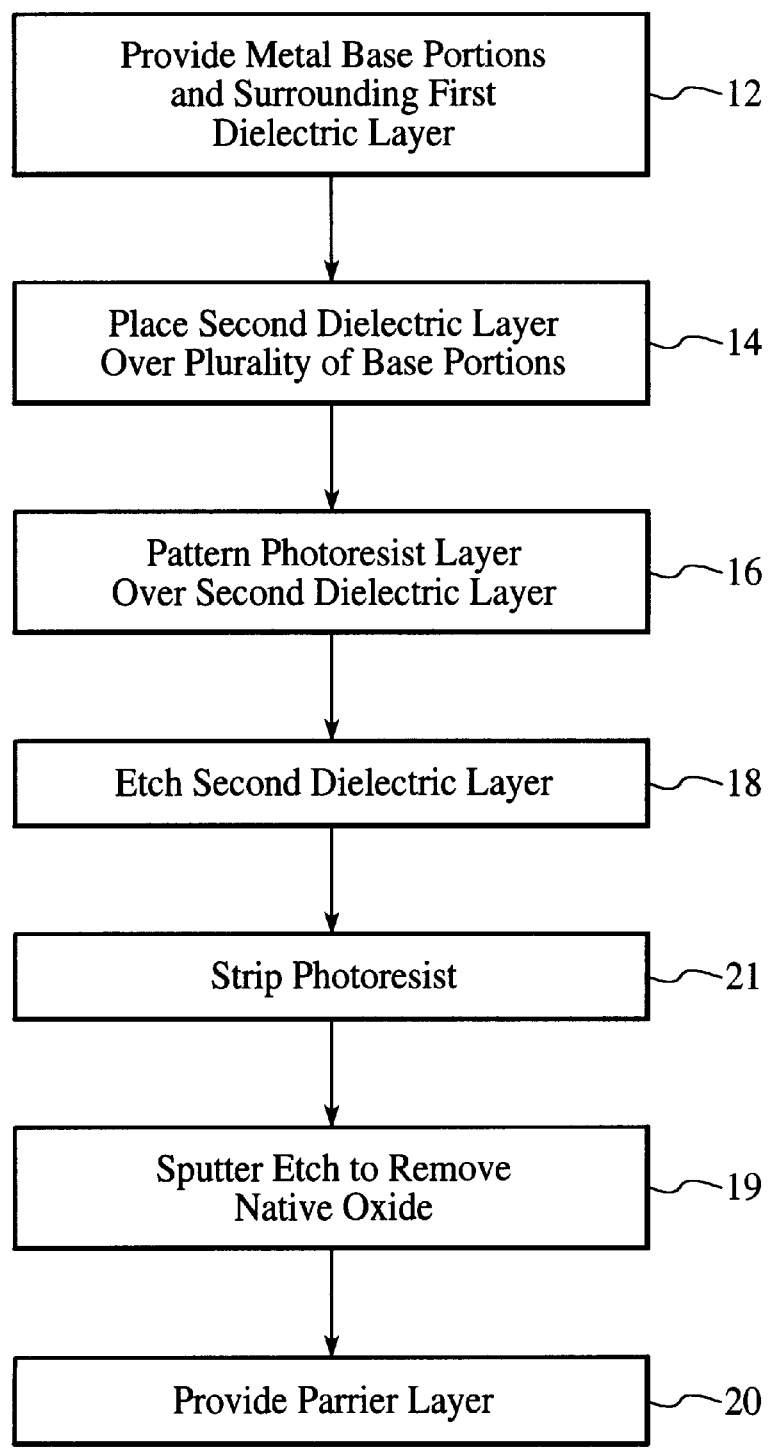
FIG. 1 is a flow chart showing a conventional process for providing an interconnect for an integrated circuit.
Figure 2A:
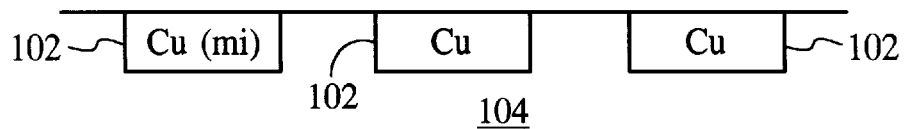
FIGS. 2a–2g are diagrams showing the formation of the interconnect from the flow chart of FIG. 1.
Figure 2B:
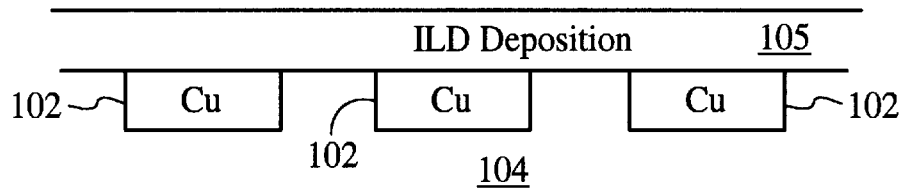
Figure 2C:
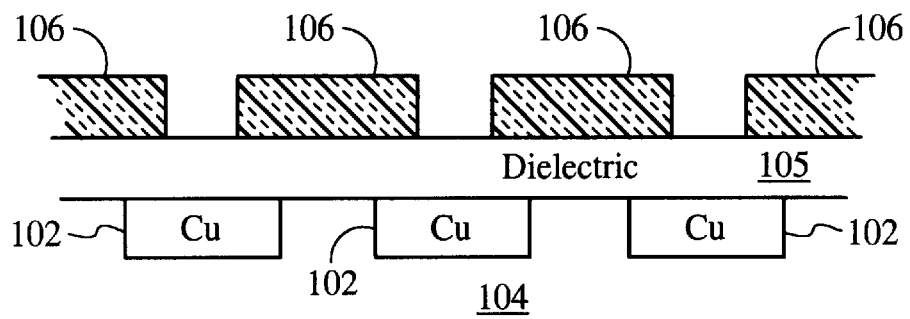
Figure 2D:
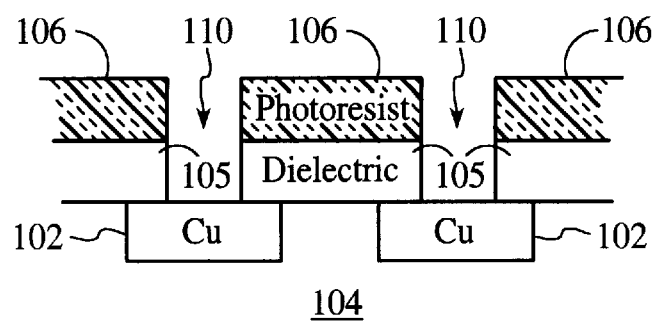
Figure 2E:
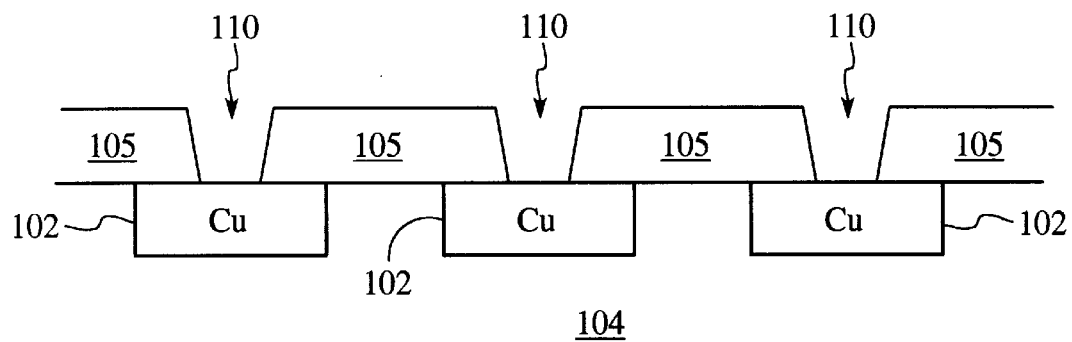

FIG. 1 is a flow chart showing a conventional process for providing an interconnect for an integrated circuit. FIGS. 2a–2g are diagrams showing the formation of the interconnect from the flow chart of FIG. 1. Referring now to FIGS. 1 and 2a–2g together, a plurality of metal base portions 102 which is surrounded by a first dielectric layer 104 is provided, via step 12 (FIG. 2a). Next, a second dielectric layer 105 is placed over the plurality of metal base portions 102, step 14 (FIG. 2b). Next, a photoresist layer 106 is patterned over the second dielectric layer 105 and the metal layer 102, via step 16 (FIG. 2c). Next, etching of the second dielectric layer takes place to provide the via hole 110, via step 18 (FIG. 2d). Next, the photoresist layer 106 is stripped, via step 21 (FIG. 2e). Before a barrier metal layer is provided inside the via hole 110, a sputter etch is performed via step 19 (FIG. 2f) to remove native oxide on top of the high conductivity metal 102; otherwise, high via resistance will occur. Then, the barrier metal layer 107 can be provided over the via hole 110, via step 20 (FIG. 2g).

Figure 2F:
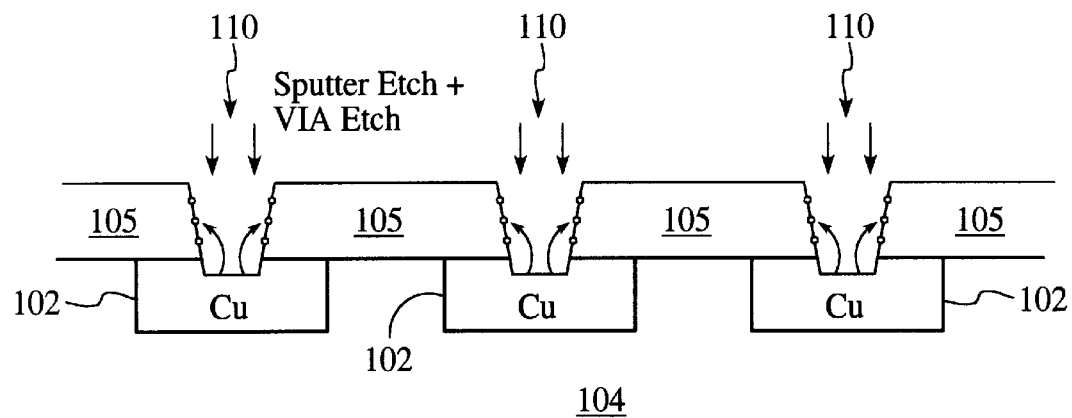
Figure 2G:
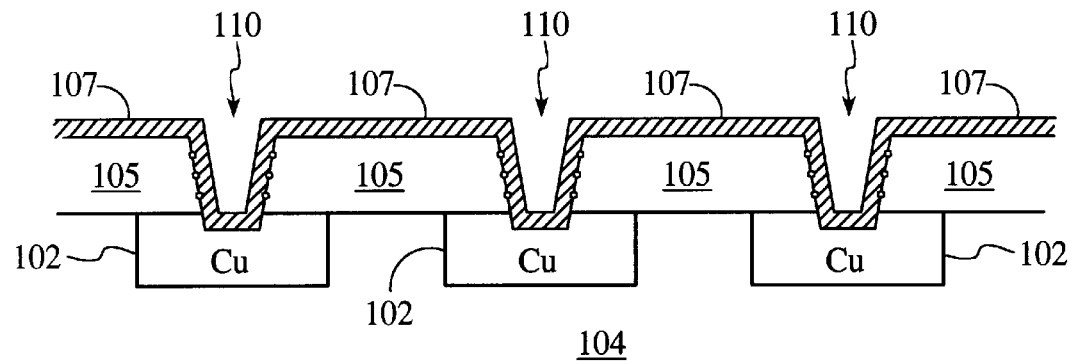

As is seen from FIGS. 2d–2f, via etch and sputter etch can cause the base portions of the plurality of metal layers 102 to sputter on the sidewalls of the second dielectric layer 105. It is well known that if the metal layer is a high conductivity metal that also has high diffusivity, such as copper, gold or platinum, it will travel through the sidewalls of the dielectric material through a diffusion process. In so doing, the performance of the device can be significantly affected due to the junction poisoning caused by this diffusion.

The present invention minimizes diffusion of a high conductivity metal on the sidewalls of the via hole through providing a via plug material that will getter or dissolve the high conductivity metal to provide an improved via structure. Examples of high conductivity metals are, for example, copper, gold, silver and chromium. However, one of ordinary skill in the art readily recognizes that a variety of materials could be utilized, the key element being that the metal has high diffusivity properties through the dielectric under an applied electric field.

In a system and method in accordance with the present invention, a conductive metal such as aluminum is provided as the via plug material to fill the hole on top of the high conductivity metal to form a via interconnect structure. However, one of ordinary skill in the art readily recognizes that a variety of materials could be utilized as the via plug material, the key element being that the conductive material, has low diffusivity properties and being capable of gettering the high diffusivity material.

Aluminum is one example of a well known metal that can be utilized as a via plug material to getter and dissolve copper, gold, silver and platinum metal/ions. For example, sputtered copper metal on the via hole sidewall during via etch and sputter etch even if left on the surface will be tied up by the aluminum provided within the via and thus prevent the possibility of copper diffusion through dielectric sidewalls.

Accordingly, by substantially filling a via hole with a via plug material on top of the high conductivity metal layer to form a via interconnect structure, the diffusion problems associated therewith are eliminated because the metal which is part of the via interconnect structure has gettered or dissolved the high conductivity metal sputtered on the sidewalls of the dielectric.

To more particularly describe the features of the present invention refer now to the following discussion in conjunction with the accompanying Figures.

Figure 3:
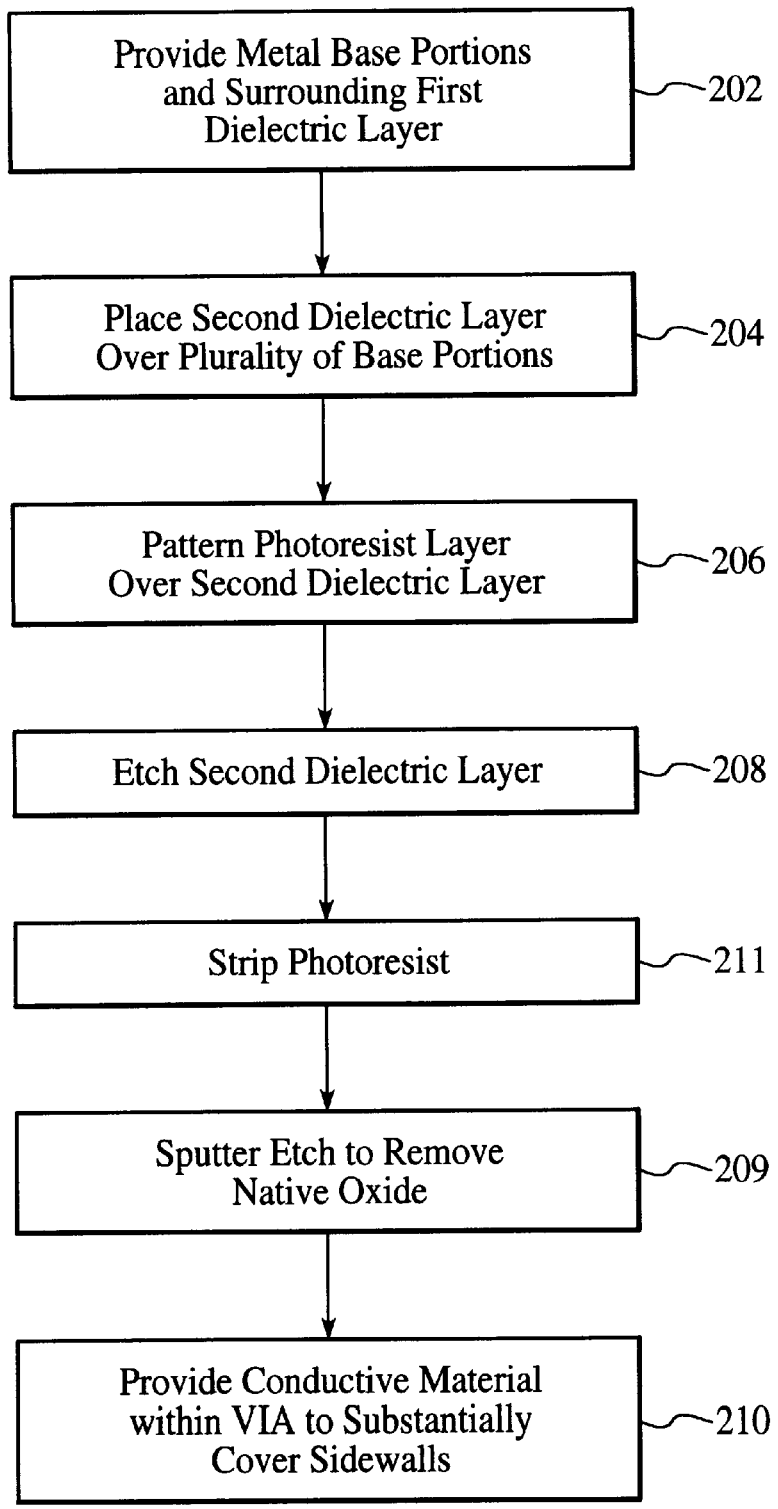
FIG. 3 is a flow chart of a process for providing an interconnect in accordance with the present invention.

FIG. 3 is a flow chart of a process for providing an interconnect in accordance with the present invention. FIGS. 4a–4g are diagrams showing the formation of the interconnect in accordance with the flow chart of FIG. 3.

Figure 4A:
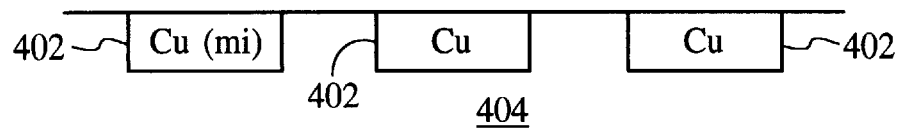
FIGS. 4a–4g are diagrams showing the formation of the interconnect in accordance with the flow chart of FIG. 3.
Figure 4B:
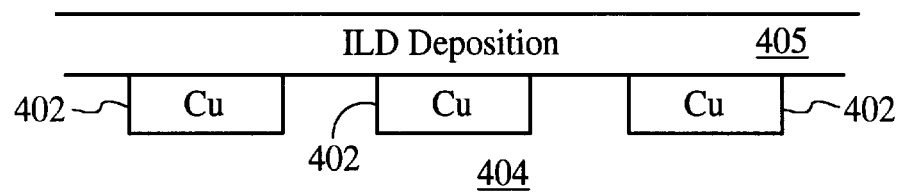
Figure 4C:
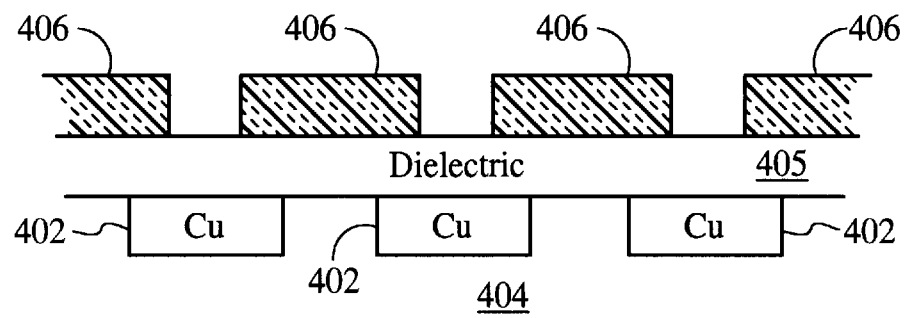
Figure 4D:
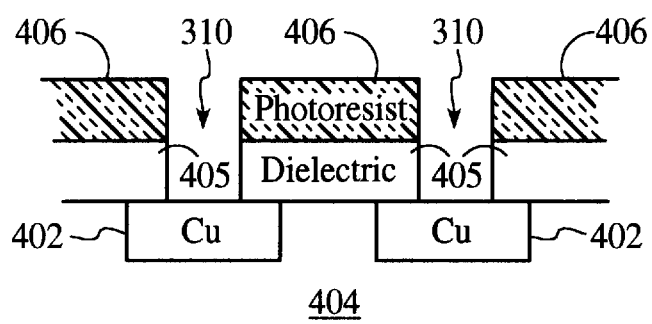
Figure 4E:
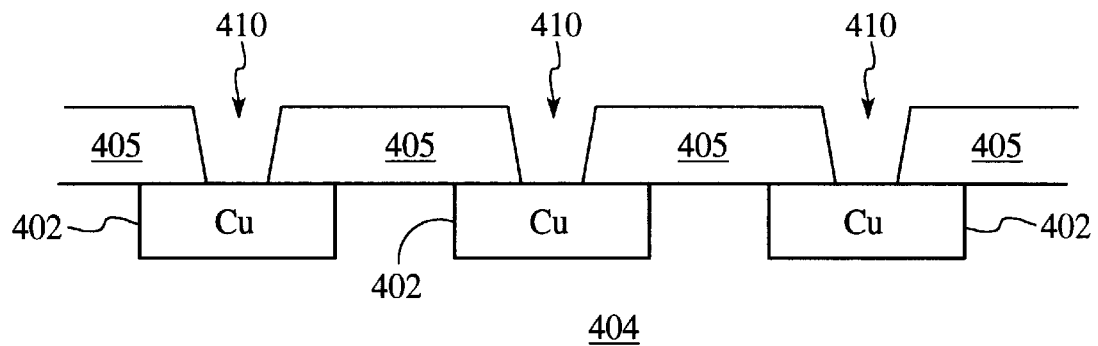
Figure 4F:
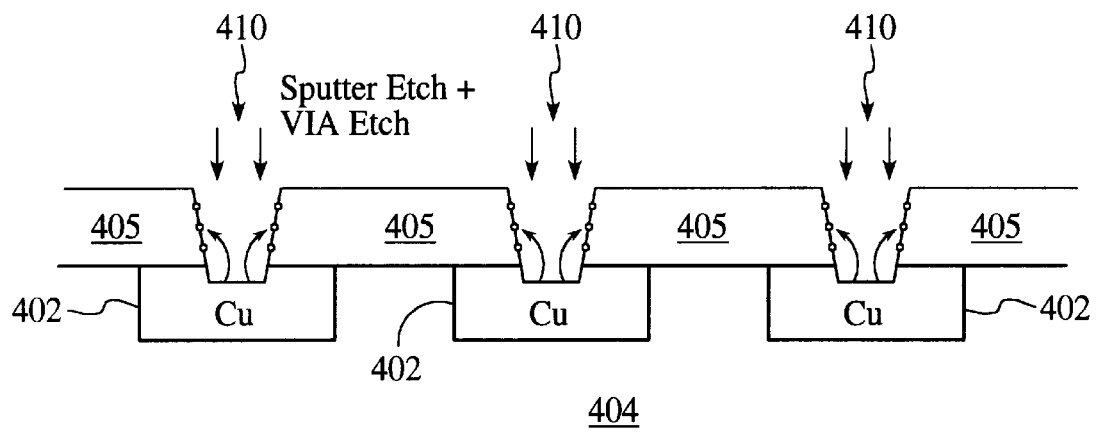
Figure 4G:
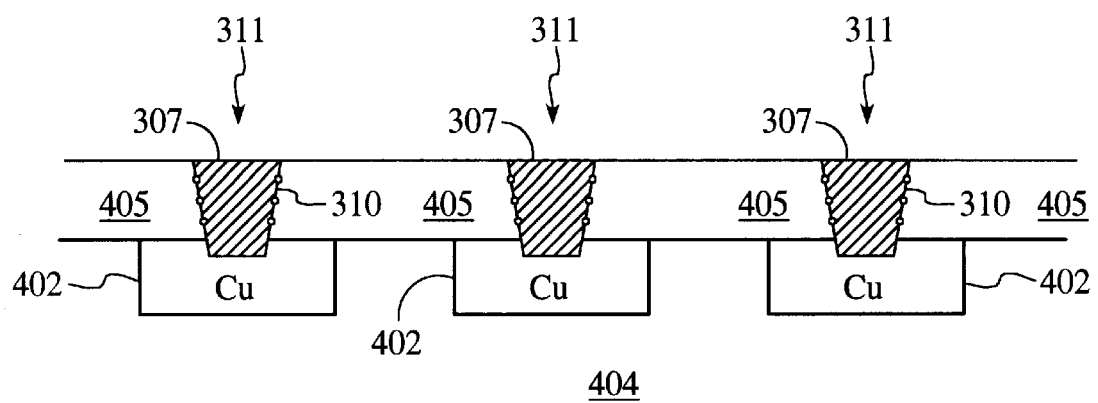

Referring now to FIGS. 3 and 4a–4g together, in a system and method in accordance with the present invention a plurality of metal base portions 402 which are surrounded by a first dielectric layer 404 are provided, via step 202 (FIG. 4a). Next, a second dielectric layer 405 is placed over the plurality of metal base portions 402, via step 204 (FIG. 4b). Next, a photoresist layer 406 is patterned over the second dielectric layer 405 and the metal layer 402, via step 204 (FIG. 4c). Next, etching of the second dielectric layer 405 takes place to provide the via 310, via step 208 (FIG. 4d). Next, the photoresist layer 406 is stripped, via step 209 (FIG. 4e). A sputter etch is performed via step 208 (FIG. 4f) to remove native oxide on top of the high conductivity metal 402; otherwise, high via resistance will occur. Thereafter, a via plug material 307 is provided that substantially fills the via hole 310 to provide a via structure 311 (FIG. 4g). The via structure 311 is composed of the via plug material 307 and the base portion of the high conductivity metal 402.

The via plug material 307 within the via structure 311, as is seen, covers the sidewalls of the dielectric layer 405. The via plug material 307 in a preferred embodiment comprises aluminum. Since aluminum dissolves some high conductivity metals, such as gold, copper and platinum, it will minimize the diffusivity of the sputtered high conductivity metal on the sidewalls of the via hole 310.

There are several different methods which can be used to form a via interconnect structure which includes a via plug material.

1. Forcefill the metal into the via.
2. Use a material with a dopant such as Ge or Ge-Cu so that reflow at lower temperature can take place.
3. Use a chemical vapor deposition CVD method.
4. Provide a plated material plug on top of a cold deposited metal via liner such as Al or Cu (Cu will be tied by Aluminum) after the via formation.

Accordingly, through a system and method in accordance with the present invention, a via plug material such as aluminum can be utilized to getter or dissolve the high conductivity metal on the sidewall. In so doing, a via interconnect structure is formed, which inherently limits the diffusion or migration of the high conductivity metal through the dielectric material thereby reducing the poisoning caused thereby.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a via structure for a high conductivity metal of an integrated circuit, the method comprising the steps of:
   (a) patterning a photoresist material and etching a dielectric material down to the high conductivity metal to form a via hole, the via hole including sputtered high conductivity metal on its sidewalls; and
   (b) providing a via plug material other than the high conductivity metal within the via hole, the via plug material substantially covering a base portion of the high conductivity metal and the sidewalls of the via hole, the via plug material for gettering the high conductivity metal sputtered on the sidewalls of the via hole.

2. The method of claim 1 in which the high conductivity metal comprises copper.

3. The method of claim 1 in which the high conductivity metal comprises platinum.

4. The method of claim 1 in which the high conductivity metal comprises gold.

5. The method of claim 1 in which the high conductivity metal comprises silver.

6. The method of claim 1 in which the via plug material comprises aluminum or an aluminum alloy.

7. The method of claim 1 in which the providing step (b) comprises the step of forcefilling the metal.

8. The method of claim 1 in which the providing step (b) comprises utilizing the via plug material with a dopant to reflow into the via.

9. The method of claim 1 in which the providing step (b) comprises providing metal utilizing a chemical vapor deposition process.

10. The method of claim 1 in which the providing step (b) comprises providing a plated plug on top of a deposited metal via liner.

11. A system for providing a via structure for a high conductivity metal of an integrated circuit comprising:
   means for patterning a photoresist material and etching a dielectric material down to the high conductivity metal to form a via hole, the via hole including sputtered high conductivity metal on its sidewalls; and
   means for providing a via plug material other than the high conductivity metal within the via hole, the via plug material substantially covering a base portion of the high conductivity metal and the sidewalls of the via hole, the via plug material for gettering the high conductivity metal sputtered on the sidewalls of the via hole.

12. The system of claim 11 wherein the high diffusivity metal comprises copper.

13. The system of claim 11 wherein the high conductivity metal comprises platinum.

14. The system of claim 11 in which the high conductivity metal comprises gold.

15. The system of claim 11 in which the high conductivity metal comprises silver.

16. The system of claim 11 in which the via plug material comprises aluminum or an aluminum alloy.

17. The system of claim 11 in which the providing means comprises means for forcefilling the via plug material.

18. The system of claim 11 in which the providing means comprises means for utilizing the via plug material with a dopant to reflow into the via.

19. The system of claim 11 in which the providing means comprises means for providing the via plug material utilizing a chemical vapor process.

20. The system of claim 11 in which the providing means comprises means for providing a plated plug on top of a deposited metal via liner.

* * * * *